United States Patent [19]

Urata

[11] Patent Number: 5,182,520

[45] Date of Patent: Jan. 26, 1993

[54] NON-LINEAR DE-EMPHASIS CIRCUIT

[75] Inventor: Kaoru Urata, Kanagawa, Japan

[73] Assignee: Sony Corporation, Tokyo, Japan

[21] Appl. No.: 722,161

[22] Filed: Jun. 27, 1991

[30] Foreign Application Priority Data

Jun. 29, 1990 [JP] Japan .................................. 2-173725

[51] Int. Cl.$^5$ ......................... H04B 1/10; H04B 15/00
[52] U.S. Cl. .................................... 328/142; 328/164; 328/165; 328/167; 307/264; 307/493
[58] Field of Search ............... 328/142, 162, 164, 165, 328/167; 307/264, 493; 358/166, 167; 333/81 R

[56] References Cited

U.S. PATENT DOCUMENTS

| | | | |
|---|---|---|---|
| 3,654,563 | 4/1972 | Hesler et al. ........................ | 328/142 |
| 4,618,893 | 10/1986 | Hirota et al. ........................ | 358/166 |
| 4,658,305 | 4/1987 | Tsushima ............................ | 358/167 |
| 4,682,251 | 7/1987 | Hirota et al. ........................ | 358/167 |
| 4,730,165 | 3/1988 | Nishino et al. ...................... | 328/142 |
| 4,849,826 | 7/1989 | Ohta ................................... | 307/490 |
| 4,931,743 | 6/1990 | Fukuda et al. ...................... | 328/167 |
| 5,032,909 | 7/1991 | Sato et al. .......................... | 358/166 |

Primary Examiner—William L. Sikes
Assistant Examiner—T. Cunningham
Attorney, Agent, or Firm—Alvin Sinderbrand; William S. Frommer

[57] ABSTRACT

In an apparatus for non-linear de-emphasis of an input signal, an amplitude limiting signal is obtained by subtracting a high-pass filtered and amplitude limited input signal from the original input signal, then the amplitude limiting signal is amplified with a gain determined by the amplitude of the amplitude limiting signal and subtracted from the input signal to provide a non-linearly de-emphasized signal with an improved signal-to-noise ratio and without substantial deterioration in high frequency small amplitude components of the input signal.

3 Claims, 8 Drawing Sheets

NON-LINEAR DE-EMPHASIS CIRCUIT

BACKGROUND OF THE INVENTION

1. Field of the Invention

This invention relates to a non-linear deemphasis circuit which is suitably applied, for example, to a video tape recorder.

2. Description of the Prior Art

Conventionally, video tape recorders are designed such that a non-linear emphasis circuit and a non-linear de-emphasis circuit are employed in order to increase the signal-to-noise (SN) ratio of a reproduction signal.

Figure 7:
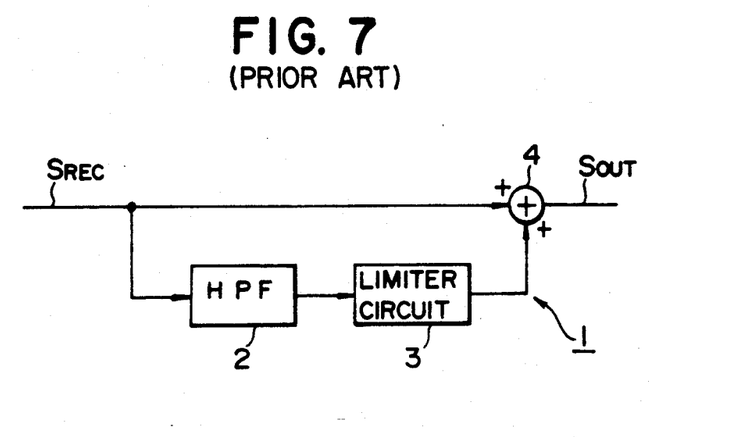
FIG. 7 is a block diagram showing a conventional non-linear emphasis circuit.

An exemplary conventional non-linear emphasis circuit is shown in FIG. 7. Referring to FIG. 7, the non-linear emphasis circuit shown is generally denoted at 1 and is constituted such that high frequency components of a recording signal $S_{REC}$ are extracted by a high-pass filter circuit (HPF) 2 and then the recording signal $S_{REC}$ is outputted to an adding circuit 4 by way of a limiter circuit 3.

Figure 8:
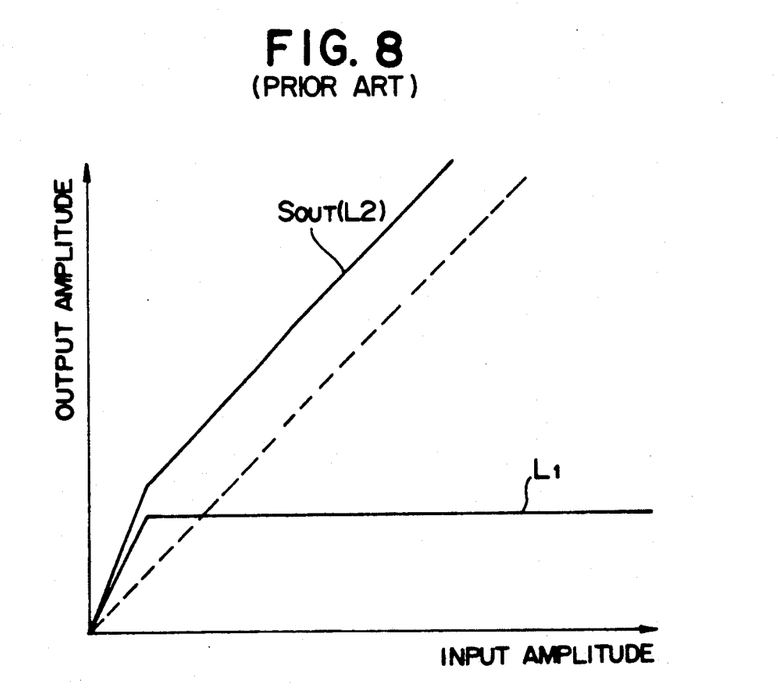
FIG. 8 is an operation diagram illustrating operation of the non-linear emphasis circuit of FIG. 7.

High frequency components of the recording signal $S_{REC}$ are amplitude limited by the limiter circuit 3 as seen from a curve L1 shown in FIG. 8.

The output signal of the limiter circuit 3 is added to the recording signal $S_{REC}$ by the adding circuit 4 to produce an output signal $S_{OUT}$ to be recorded on a magnetic tape. Consequently, the recording signal $S_{REC}$ is recorded with its high frequency components of small amplitudes emphasized as seen from another curve L2 shown in FIG. 8.

Figure 9:
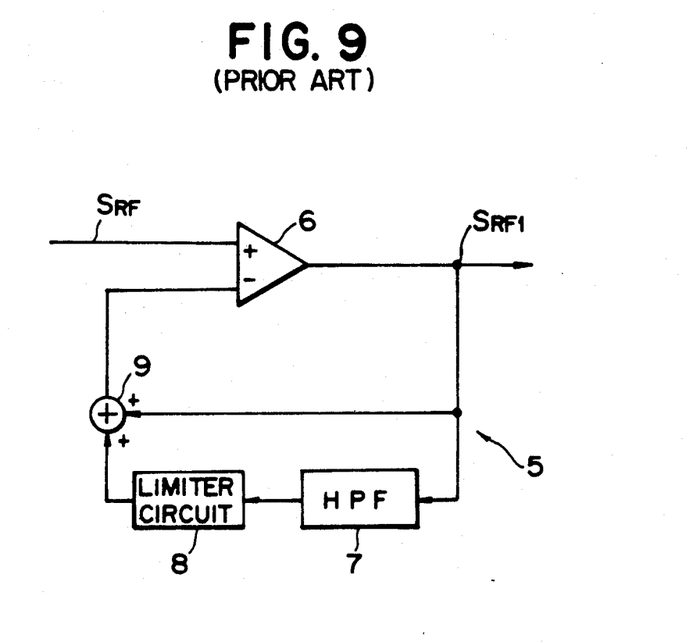
FIG. 9 is a block diagram showing a conventional non-linear de-emphasis circuit.

A conventional non-linear de-emphasis circuit is shown in FIG. 9. Referring to FIG. 9, the non-linear de-emphasis circuit is generally denoted at 5 and is constituted such that an input reproduction signal $S_{RF}$ is applied to a differential amplifier circuit 6, and a feedback loop to the differential amplifier circuit 6 is formed by a high-pass filter circuit 7, a limiter circuit 8 and an adding circuit 9.

Figure 10:
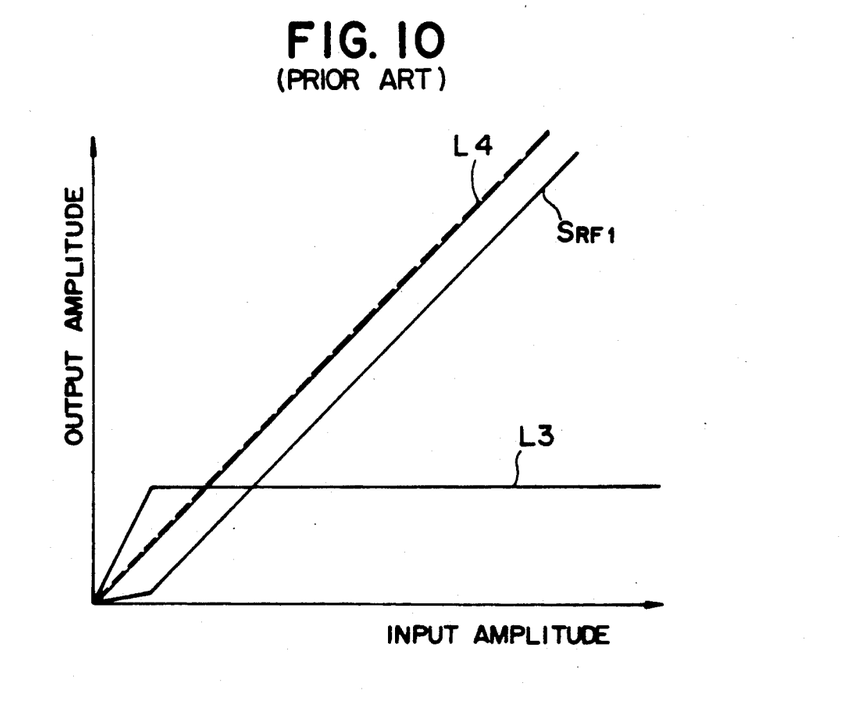
FIG. 10 is an operation diagram illustrating operation of the non-linear de-emphasis circuit of FIG. 9.

Characteristics of the high-pass filter circuit 7, limiter circuit 8 and adding circuit 9 are set to the same characteristics (shown by a curve L3 in FIG. 10) as those of the high-pass filter circuit 2, limiter circuit 3 and adding circuit 4 of the non-linear emphasis circuit 1 so that a reproduction signal $S_{RF}$ may be corrected with an inverse characteristic to that of the non-linear emphasis circuit 1. The output signal of the non-linear de-emphasis circuit 5 is illustrated by a curve $S_{RF1}$ shown in FIG. 10.

Consequently, the transfer function of the recording and reproducing system is 1 and noise in small amplitudes in high frequency components is suppressed.

Figure 11:
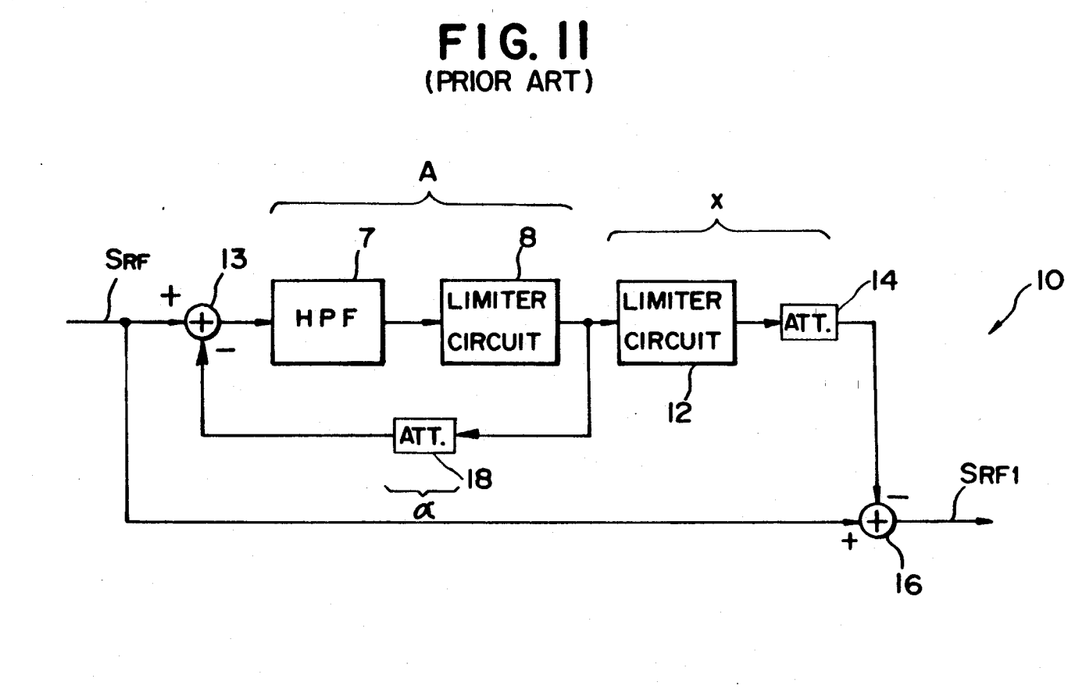
FIG. 11 is a block diagram showing another conventional non-linear de-emphasis circuit for achieving an improved SN ratio.

Another exemplary conventional non-linear de-emphasis circuit is disclosed in Japanese Patent Laid-Open Application No. 62-123881 and shown in FIG. 11. Referring to FIG. 11, the non-linear deemphasis circuit is generally denoted at 10 and is constituted such that a limiter circuit 12 is provided separately to effect amplitude limiting in order to further raise the improvement in SN ratio.

In particular, an input reproduction signal $S_{RF}$ is received at a subtracting circuit 13, and an output signal of the subtracting circuit 13 is fed back to the subtracting circuit 13 by way of a high-pass filter circuit 7 and a limiter circuit 8.

Thus, at the subtracting circuit 13, an output signal of the limiter circuit 8 is subtracted from the input reproduction signal $S_{RF}$. Accordingly, a similar characteristic to that of the non-linear de-emphasis circuit 5, wherein a feedback loop to the differential amplifier circuit 6 is formed as described hereinabove with reference to FIG. 9, is obtained.

Subtraction of the output signal of the limiter circuit 8 from the reproduction signal $S_{RF}$ is performed, in the non-linear de-emphasis circuit 10, by a subtracting circuit 16. The output signal of the limiter circuit 8 is transmitted to the subtracting circuit 16 by way of the limiter circuit 12 and an attenuator 14.

Figure 12:
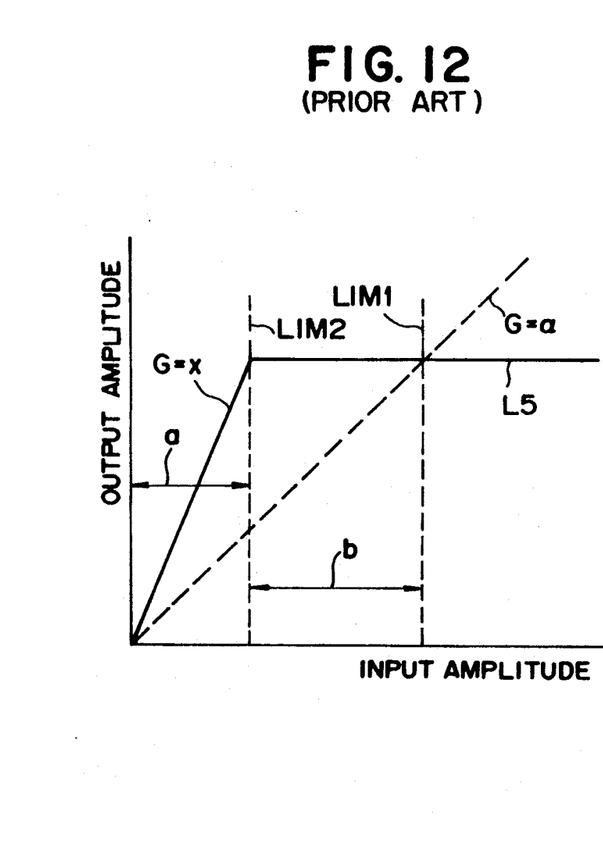
FIGS. 12 to 14 are operation diagrams illustrating operation of the non-linear de-emphasis circuit of FIG. 11.

As seen from FIG. 12, the limiter circuit 12 further amplitude limits its input signal at a second amplitude limiting value LIM2 which is lower than a maximum output amplitude, i.e., the first amplitude limiting value LIM1 of the limiter circuit 8.

The gain x of the limiter circuit 12 and attenuator 14, when the amplitude of the output signal of the limiter circuit 8 is small, is maintained so that it satisfies the following expression:

$$\alpha < x \leq \frac{1 + A\alpha}{A} \qquad (1)$$

where A is a gain of the high-pass filter circuit 7 and limiter circuit 8 for a small amplitude of a high frequency and $\alpha$ is a gain of an attenuator 18 interposed between the limiter circuit 8 and the subtracting circuit 13. Thus, the input/output characteristic of the limiter circuit 12 and the attenuator 14 is as illustrated by a curve L5 shown in FIG. 12.

Figure 13:
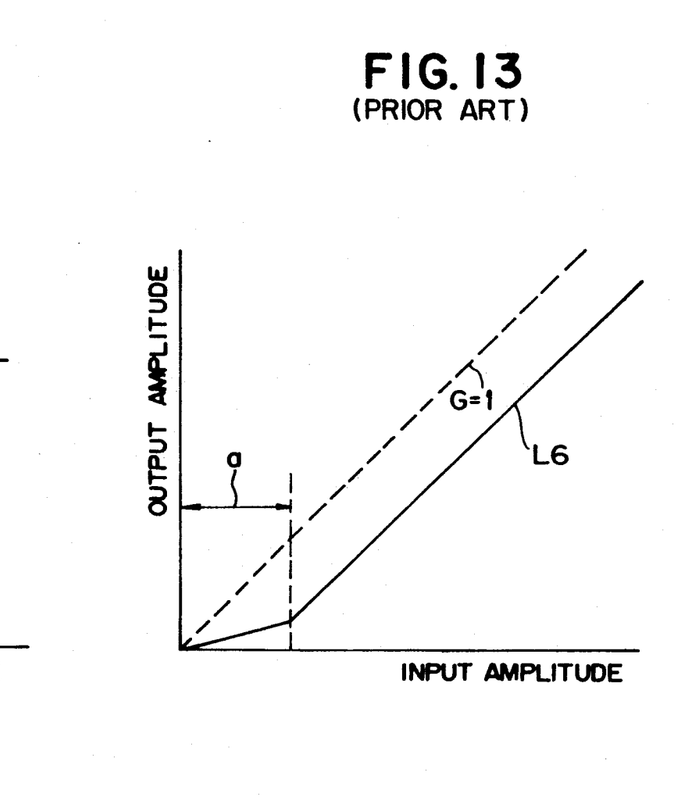

Consequently, an input/output characteristic is obtained wherein high frequency small amplitudes are suppressed, compared with the non-linear de-emphasis circuit 5, in a region a over which the limiter circuit 12 does not perform amplitude limitation as seen from FIG. 13.

Figure 14:
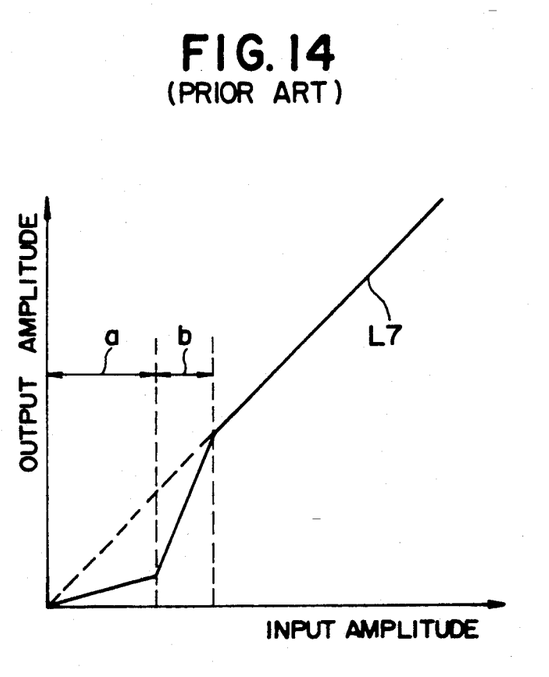

Accordingly, high frequency small amplitudes are suppressed by the entire recording and reproducing system, as seen from a curve L7 shown in FIG. 14, and the SN ratio improvement achieved using the non-linear de-emphasis circuit 10 is increased with respect to the SN ratio improvement achieved using the non-linear de-emphasis circuit 5.

However, while the improvement in SN ratio of the non-linear de-emphasis circuit 10 is high, the high frequency small amplitudes are suppressed in the region a also include desired input signal components and as a result, there is a problem in that a delicate contour of a reproduction picture image is damaged since input signal high frequency small amplitude components are undesirably suppressed.

SUMMARY OF THE INVENTION

It is an object of the present invention to provide a non-linear de-emphasis circuit which assures an improved SN ratio with a simple construction without undesirably suppressing high frequency small amplitude input signal components, that is, damaging a delicate contour of a reproduction picture image.

In order to attain this objective, according to the present invention, there is provided an apparatus for non-linear de-emphasis of an input signal which comprises first subtracting means for subtracting said amplitude limiting signal from an input signal so as to produce first subtracted signal, a high-pass for extracting high frequency components from filtering means said first subtracted signal so as to produce high frequency signal, first limiting means having a first amplitude limiting value for amplitude limiting said high frequency signal so as to produce said amplitude limiting signal, non-linear amplifying means for amplifying, when said amplitude limiting signal has a smaller amplitude than said first amplitude limiting value, said amplitude limiting signal with a said amplitude limiting signal is equal to or higher than said first amplitude limiting value, said amplitude limiting signal with a gain equal to 1, so as to provide a non-liner amplified signal, and second subtracting means for subtracting the non-linear amplified signal from the input signal so as to produce a non-linear de-emphasized signal.

When an amplitude limiting signal is to be subtracted from an input signal to obtain an inverse characteristic to that of a non-linear emphasis circuit, such subtraction is performed by way of a non-linear amplifier circuit which amplifies, when the amplitude limiting signal has a smaller amplitude than an amplitude limiting value of a first limiter circuit, the amplitude limiting signal with a gain higher than 1, and which amplifies, when the amplitude of the amplitude limiting signal is equal to or higher than the amplitude limiting value of the first limiter circuit, the amplitude limiting signal with a gain equal to 1. Accordingly, high frequency small amplitude noise is suppressed, and the non-linear de-emphasis circuit improves the SN ratio of an input signal using a simple construction while reducing any deterioration in delicate contours of a reproduction picture image by reducing the suppression of input signal high frequency small amplitude components.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
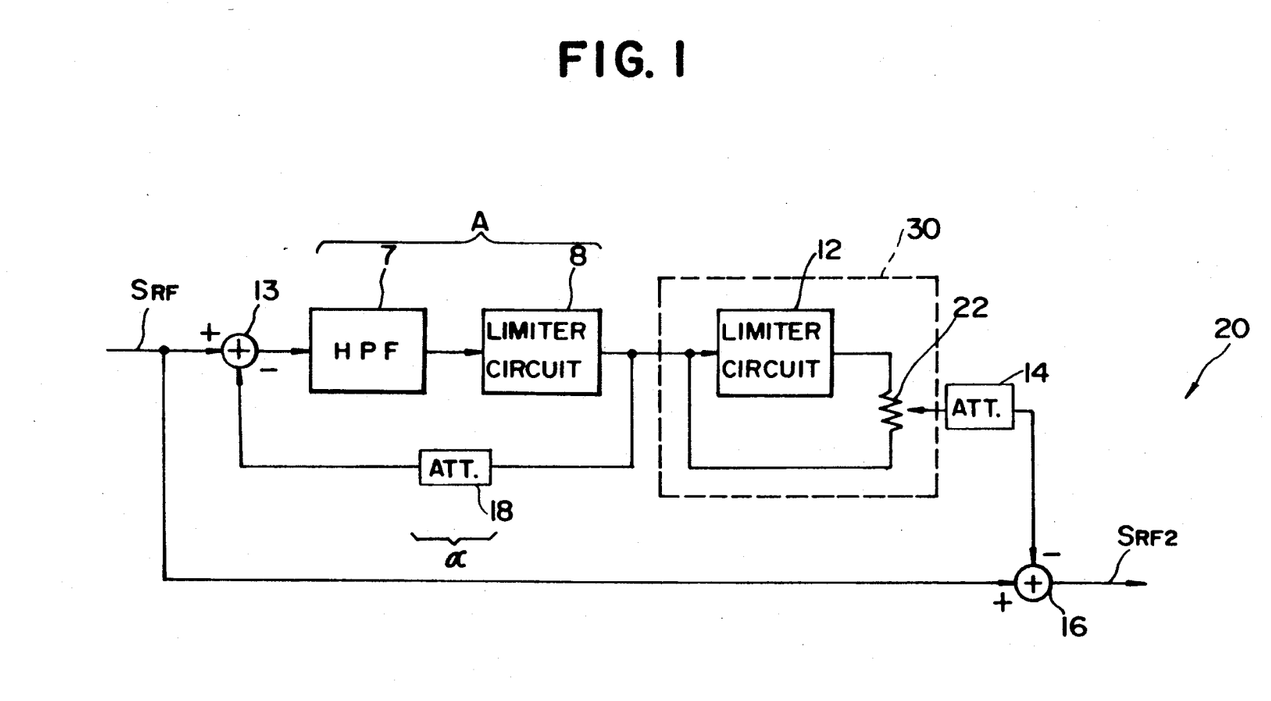
FIG. 1 is a block diagram of a non-linear de-emphasis circuit showing a preferred embodiment of the present invention.

Referring first to FIG. 1, there is shown a non-linear de-emphasis circuit in which the present invention is applied. The non-linear de-emphasis circuit generally denoted at 20 has some common construction with that of the conventional non-linear de-emphasis circuit described hereinabove with reference to FIG. 11. Accordingly, reference is had to the foregoing description of such common construction and description of such common construction is omitted herein for brevity. The non-linear de-emphasis circuit 20 is different from the conventional non-linear de-emphasis circuit shown in FIG. 11 in that it additionally includes a mixer 22 interposed between the limiter circuit 12 and the attenuator 14 such that input and output signals of the limiter circuit 12 are mixed at a desired mixing ratio and such mixed signal is outputted to the attenuator 14. As shown in FIG. 1, the mixer 22 may be constituted as a potentiometer, that is, a variable resistor with three terminals in active use. The non-linear amplifier circuit comprising limiter circuit 12 and mixer 22 is generally denoted by the reference numeral 30.

Figure 2:
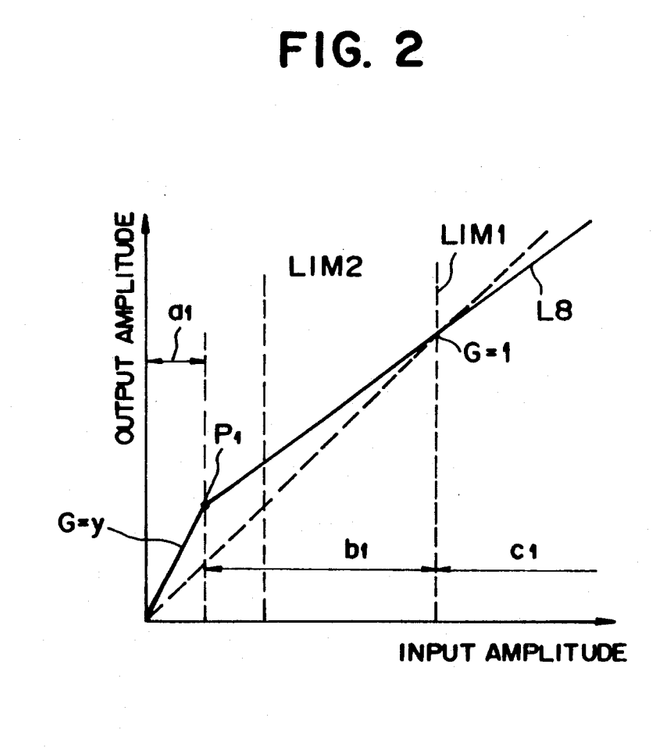
FIGS. 2 to 4 are operation diagrams illustrating operation of the non-linear de-emphasis circuit of FIG. 1.

Accordingly, when the amplitude of the output signal of the limiter circuit 8 is small, the output signal of the attenuator 14 has, as seen from a curve L8 of FIG. 2, a gain G (=y) with respect to an input signal to the limiter circuit 12, which is maintained so that it satisfies the following expression:

$$1 < y \leq \frac{1 + A\alpha}{A\alpha} \qquad (2)$$

and then the gain drops from a point P1 which is determined by a limiting ratio of the mixer 22 lower than an amplitude limiting value LIM2 of the limiter circuit 12, and intersects with a straight line at 45 degree slope, indicated as a broken line and representating a gain equal to 1, at an amplitude limiting value LIM1 of the limiter circuit 8.

Figure 3:
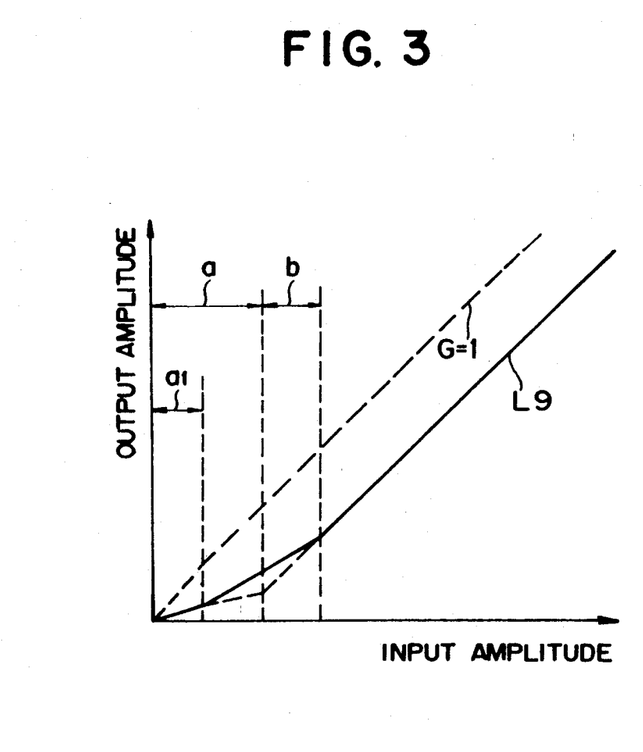

In FIG. 3, a curve L9 represents the characteristic of the non-linear de-emphasis circuit 20 of FIG. 1, that is, the gain of $S_{RF2}$ with respect to $S_{RF}$. As seen from the curve L9 of FIG. 3 (in which an input/output characteristic having a gain of 1 is indicated by a broken line) by using the non-linear de-emphasis circuit 20 shown in FIG. 1 a region $a_1$ within which the gain rises with the value G (=y) can be made smaller than a region a within which the gain rises similarly with the value G (=y) to resulting from use of the conventional non-linear de-emphasis circuit 10 shown in FIG. 11.

Accordingly, the SN ratio can be improved, without substantial deterioration of a delicate contour of a reproduction picture image, by the amount over which the region $a_1$ within which the gain rises with the value G (=y) is reduced relative to the region a, with the simple insertion of the mixer 22 between the limiter circuit 12 and the attenuator 14.

Figure 4:
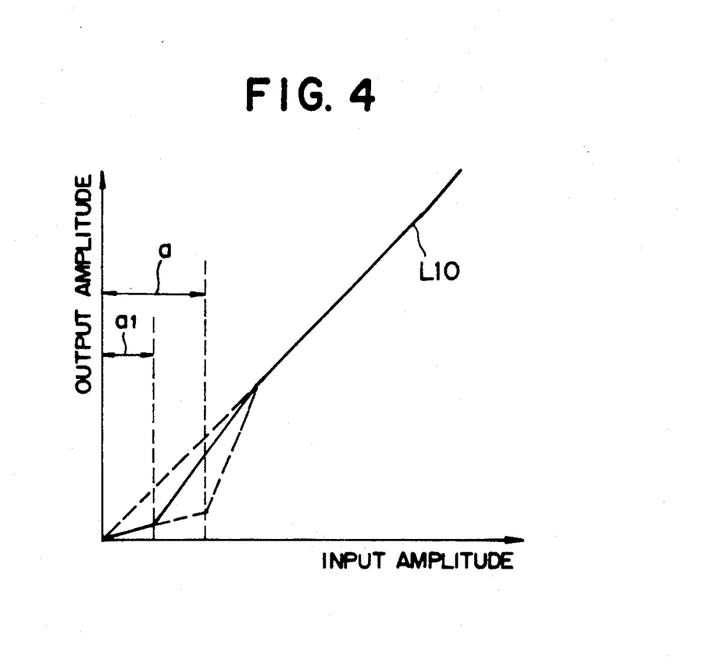

In particular, as seen from a curve L10 of FIG. 4 which shows a general input/output characteristic of the non-linear de-emphasis circuit 20, the region in which input signal high frequency small amplitudes are suppressed is decreased sufficiently for the practical use of the present non-linear de-emphasis circuit as compared with the prior art non-linear de-emphasis circuit, and the SN ration can be further improved with substantially less deterioration of a delicate contour of a reproduction picture image.

Further, since a variable resistor is employed as the mixer 22, the characteristic of the non-linear de-emphasis circuit 20 can be chosen freely in a range between the characteristic of the non-linear de-emphasis circuit 5 described hereinabove with reference to FIG. 9 and the characteristic of the non-linear de-emphasis circuit 10 described hereinabove with reference to FIG. 11 to obtain a desired noise reduction.

In the present embodiment, the subtracting circuit 13 constitutes first subtracting means for subtracting an amplitude limiting signal from an input signal $S_{RF}$, the high-pass filter circuit 7 constitutes high-pass filtering means for extracting high frequency components from an output signal of the subtracting circuit 13, the limiter circuit 8 and attenuator 18 constitute first limiting means having an amplitude limiting value LIM1 for amplitude limiting an output signal of the high-pass filter circuit 7 to produce the amplitude limiting signal, the limiter circuit 12, attenuator 14 and mixer 22 constitute non-linear amplifying means for amplifying when the amplitude limiting signal has a smaller amplitude ($a_1$) than the amplitude limiting value LIM1, the amplitude limiting signal with a gain higher than 1 and for amplifying, when the amplitude limiting signal is equal to or higher than the amplitude limiting value LIM1, the amplitude limiting signal with a gain equal to 1, and the subtracting circuit 16 constitutes second subtracting means for subtracting an output signal of the non-linear amplifying means from the input signal $S_{RF}$.

With a non-linear de-emphasis circuit of the construction described above, an input reproduction signal $S_{RF}$ is outputted by way of the subtracting circuit 13 to the high-pass filter 7, at which high frequency components are extracted from the reproduction signal $S_{RF}$, whereafter the reproduction signal $S_{RF}$ is amplitude limited by the limiter circuit 8.

Consequently, an inverse characteristic to that of a non-linear emphasis circuit can be obtained by subtracting an output signal of the limiter circuit 8 from the original reproduction signal $S_{RF}$.

In particular, an output signal of the limiter circuit 8 is fed back to the subtracting circuit 13 by way of the attenuator 18 and outputted to a non-linear amplifier circuit.

In the non-linear amplifier circuit, the output signal of the limiter circuit 8 is first amplitude limited by the limiter circuit 12 and then mixed with the output signal of the limiter circuit 8 by the mixer 22, and an output signal of the mixer 22 is outputted to the subtracting circuit 16 by way of the attenuator 14.

At the subtracting circuit 16, the output signal of the non-linear amplifier circuit 8 is subtracted from the original reproduction signal $S_{RF}$. Consequently, an inverse characteristic to that of the non-linear emphasis circuit is obtained.

In this instance, since the output signal of the limiter circuit 8 is amplitude limited by the limiter circuit 12 and mixed by the mixer 22 and then subtracted from the original reproduction signal $S_{RF}$, high frequency components can be suppressed in the region $a_1$ in which the amplitude is sufficiently smaller than the amplitude limiting value LIM2 of the limiter circuit 12 to permit practical use, and the SN ratio can be improved without substantial delerioration of a delicate contour of a reproduction picture image.

According to the construction described above, when an output signal of the limiter circuit 8 is to be subtracted from a reproduction signal to obtain an inverse characteristic to that of a non-linear emphasis circuit, it is first amplitude limited by the limiter circuit 12 and mixed by the mixer 22 and then subtracted from the original reproduction signal $S_{RF}$. Consequently, high frequency components can be suppressed in the region $a_1$ wherein the amplitude is smaller than the amplitude limiting value LIM2 of the limiter circuit 12, and the SN ratio can be improved with a simple construction without substantial deterioration of a delicate contour of a reproduction picture image.

While a non-linear amplifier circuit comprises the limiter circuit 12 and mixer 22 in the non-linear de-emphasis circuit 20 of the embodiment described above, the present invention is not limited to this construction, and if the characteristic is such as shown in FIG. 2, then non-linear amplifier circuits of various constructions can be employed. Another such non-linear amplifier circuit is shown in FIG. 5.

Figure 5:
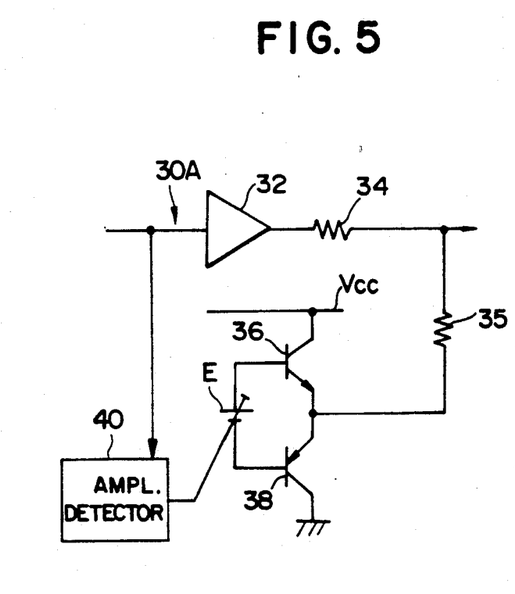
FIG. 5 is a connection diagram of a non-linear amplifier circuit showing a second preferred embodiment of the present invention.

Referring to FIG. 5, the non-linear amplifier circuit shown is generally denoted at 30 A and is constituted such that an output signal of the limiter circuit 8 is applied to an amplifier circuit 32 and an output signal of the amplifier circuit 30 is outputted to the attenuator 14 by way of a resistor 34.

Further, the output end of the resistor 34 adjacent the attenuator 14 is connected to the emitters of a pair of transistors 36 and 38 by way of a resistor 35.

Figure 6:
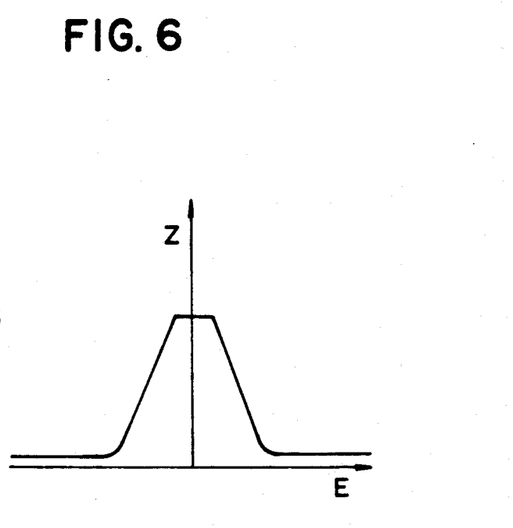
FIG. 6 is an operation diagram illustrating operation of the non-linear amplifier circuit of FIG. 5.

The collectors of the transistors 36 and 38 are connected to a power source line Vcc and the ground, respectively, so that they may be switched to an onstate in response to a potential difference E between the bases thereof as seen from FIG. 6. The output signal of the limiter circuit 8 is also supplied to an amplitude detector 40, which controls the potential difference E in response to the output signal of the limiter circuit 8.

Accordingly, by controlling the potential difference E between the bases of the transistors 36 and 38 in response to the amplitude limiting signal of the limiter circuit 8, the amplitude limiting signal from the limiter circuit 8 is outputted, when at a small amplitude, with an impedance which is defined by the resistor 34, but is outputted, as the amplitude increases, at a signal level provided by voltage division by the resistors 34 and 35.

Accordingly, a non-linear amplifier circuit having the same characteristic as the non-linear amplifier circuit shown in FIG. 1 can be obtained by suitably selecting resistance values of the resistors 34 and 35 and a gain of the amplifier circuit 32.

While the present invention is described for application to a video tape recorder, the application of the present invention is not limited to such video tape recorder, and the present invention can be applied widely to a reproducing system for a video signal, and further is not limited to a video signal, but can also be applied to a reproducing system for an audio signal to improve its SN ratio without causing substantial deterioration in high frequency small amplitude components of a reproduction signal.

Although illustrative embodiments of the present invention, and various modifications thereof, have been described in detail herein with reference to the accompanying drawings, it will be apparent to one skilled in the art that the invention not limited to these precise embodiments and that many changes and modifications can be made thereto without departing from the spirit and scope of the invention as defined in the appended claims.

What is claimed is:

1. An apparatus for non-linear de-emphasis of an input signal, comprising:

first subtracting means for subtracting an amplitude limiting signal from said input signal so as to produce a first subtracted signal;

high-pass filtering means for extracting high frequency components from said first subtracted signal so as to produce a high frequency signal;

first limiting means having a first amplitude limiting value for amplitude limiting said high frequency signal so as to produce said amplitude limiting signal;

non-linear amplifying means for amplifying, when said amplitude limiting signal has a smaller amplitude than a predetermined value, said amplitude limiting signal with a gain higher than 1, and for amplifying, when the amplitude of said amplitude limiting signal is equal to or higher than said predetermined value, said amplitude limiting signal with a gain less than 1, so as to produce a non-linear amplified signal; and second subtracting means for subtracting said non-linear amplified signal from said input signal so as to produce a non-linearly de-emphasized signal.

2. An apparatus for non-linear de-emphasis of an input signal according to claim 1, wherein said non-linear amplifying means includes second limiting means having a second amplitude limiting value lower than said first amplitude limiting value for further amplitude limiting said amplitude limiting signal, and mixing means for mixing at a desired mixing ratio the further amplitude limited signal with said amplitude limiting signal, and wherein said non-linear amplifying means has a non-linear input/output amplifying characteristic determined by said mixing ratio when said amplitude limiting signal has an amplitude lower than said first amplitude limiting value.

3. An apparatus for non-linear de-emphasis of an input signal according to claim 1, wherein said non-linear amplifying means includes amplifying means to which said amplitude limiting signal is supplied for producing an amplified signal, first resistive means supplied with said amplified signal, second resistive means connected to said first resistive means and supplied with a potential signal having a variable amplitude, and amplitude detecting means, having a detectable value and supplied with said amplitude limiting signal, for controlling said variable amplitude of said potential signal on the basis of the amplitude of said amplitude limiting signal, and wherein said amplitude limiting signal is output from said non-linear amplifying means at a signal level provided by said first resistive means when the amplitude of the amplitude limiting signal is lower than said detectable value and, when the amplitude of the amplitude limiting signal is equal to or higher than said detectable value, said amplitude limiting signal is output from said non-linear amplifying means at a signal level provided by voltage division between said first and second resistive means.

* * * * *